US008575925B2

(12) United States Patent
Hsieh

(10) Patent No.: US 8,575,925 B2
(45) Date of Patent: Nov. 5, 2013

(54) METHODS FOR DETECTING AND IMAGING MAGNETIC METALLOPROTEINS

(75) Inventor: Shu-Chen Hsieh, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 362 days.

(21) Appl. No.: 12/911,499

(22) Filed: Oct. 25, 2010

(65) Prior Publication Data

US 2011/0227566 A1 Sep. 22, 2011

(30) Foreign Application Priority Data

Mar. 17, 2010 (TW) ................................ 99107768 A

(51) Int. Cl.
*G01R 33/02* (2006.01)
*G01N 33/20* (2006.01)

(52) U.S. Cl.
USPC ............................................ 324/244; 436/73

(58) Field of Classification Search
USPC ........................................................ 324/244
See application file for complete search history.

(56) References Cited

U.S. PATENT DOCUMENTS

| | | | | |
|---|---|---|---|---|
| 8,034,634 | B2 * | 10/2011 | Hong et al. | 436/526 |
| 2003/0102863 | A1 * | 6/2003 | Wu | 324/244 |
| 2004/0245980 | A1 * | 12/2004 | Getty et al. | 324/76.11 |
| 2008/0020487 | A1 * | 1/2008 | McLean et al. | 438/1 |
| 2010/0092765 | A1 * | 4/2010 | Hager et al. | 428/331 |
| 2011/0054096 | A1 * | 3/2011 | Russell et al. | 524/188 |

FOREIGN PATENT DOCUMENTS

DE 10241409 A1 * 3/2004

OTHER PUBLICATIONS

Partial Translation of DE10241409a1, Mar. 2002.*
Daniels, "Investigation of the magnetic properties of ferritin by AFM imaging with magnetic sample modulation", Anal Bioanal Chem (2009) 394:215-223.

* cited by examiner

*Primary Examiner* — Bot Ledynh
(74) *Attorney, Agent, or Firm* — Pai Patent & Trademark Law Firm; Chao-Chang David Pai

(57) ABSTRACT

The invention provides a method for detecting and imaging magnetic metalloproteins. A substrate is provided. A plurality of magnetic metalloproteins are formed on the substrate. The magnetic metalloproteins are detected and imaged by magnetic force microscopy (MFM) to obtain topographic images, phase images and MFM images of the magnetic metalloproteins.

9 Claims, 4 Drawing Sheets

40
50
30
20
10
70
60

METHODS FOR DETECTING AND IMAGING MAGNETIC METALLOPROTEINS

CROSS REFERENCE TO RELATED APPLICATIONS

This application claims priority of Taiwan Patent Application No. 099107768, filed on Mar. 17, 2010, the entirety of which is incorporated by reference herein.

BACKGROUND OF THE INVENTION

1. Field of the Invention

The present invention relates to a method for detecting a magnetic material, and in particular relates to a method for detecting and imaging magnetic metalloproteins.

2. Description of the Related Art

There are many kinds of metalloproteins in a human body, of which, there are iron storage proteins, called ferritin proteins, which provide the iron required for the provision of the human body. Additionally, ferritin proteins are associated with many diseases, such as anemia, malignancy, etc. Therefore, detecting the ferritin proteins can provide important pathological information to assist diagnosis and therapy of diseases related thereto.

To date, there have been a number of methods for the detection and imaging of ferritin proteins. Electron microscopy is a well known imaging technique, but the vacuum environment used may lead to denaturation of biological molecules. Accordingly, because ferritin proteins contain magnetic $Fe_3O_4$, magnetic resonance imaging (MRI) or a superconducting quantum interference device (SQUID) is used to detect ferritin proteins. However, the two mentioned instruments are very expensive.

Daniels (*Anal. Bioanal. Chem.* 2009, 394, 215-223) recently reported using magnetic sample modulation (MSM) combined with atomic force microscopy (AFM) to detect ferritin proteins. However, imposing applied magnetic fields on sample stages, may lead to destructive changes in the samples.

Accordingly, there is a need to develop a method for detecting and imaging magnetic metalloproteins, in which a sample is not needed to be placed in a special environment and in which as sample is not destroyed.

BRIEF SUMMARY OF THE INVENTION

The invention provides a method for detecting and imaging magnetic metalloproteins, comprising: providing a substrate; forming a plurality of magnetic metalloproteins on the substrate; and detecting and imaging magnetic metalloproteins by magnetic force microscopy (MFM) to obtain topographic images, phase images and MFM images of the magnetic metalloproteins.

A detailed description is given in the following embodiments with reference to the accompanying drawings.

BRIEF DESCRIPTION OF THE DRAWING

For a more complete understanding of the present invention, and the advantages thereof, reference is now made to the following descriptions taken in conjunction with the accompanying drawings, in which.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The invention provides a method for detecting and imaging magnetic metalloproteins. The magnetic metalloproteins are formed on the hydrophobic substrate and are detected by magnetic force microscopy (MFM).

Figure 1:
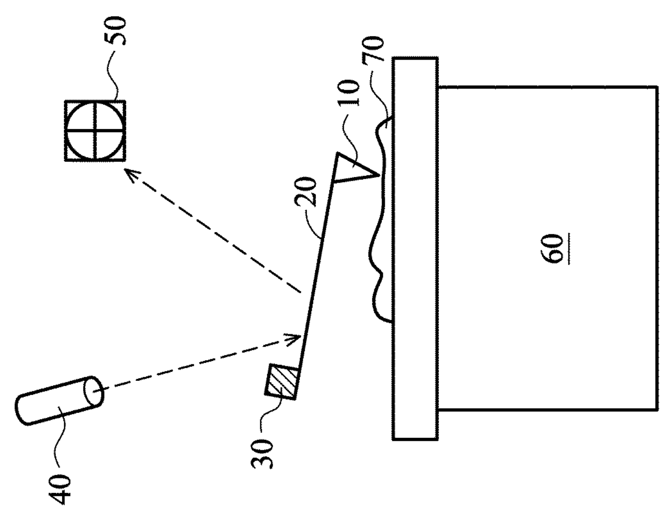
FIG. 1 shows a cross-sectional schematic representation of the basic structure of a magnetic force microscope (MFM) in accordance with the invention.

FIG. 1 shows a cross-sectional schematic representation of the basic structure of a magnetic force microscope (MFM), in which the MFM comprises: a tip 10, a cantilever 20, a piazo 30, a laser 40, a photodiode 50 and a sample stage 60, wherein the tip 10 is on one end of the cantilever 20 to detect the forces between the tip 10 and the sample 70, the piazo 30 is on the other end of the cantilever 20 to impose a oscillation frequency on the cantilever 20, the laser light 40 irradiates the light to the cantilever 20, the photodiode 50 is used to convert the light signal to the electronic signal, and the sample stage 60 is used to hold the sample 70. To simplify the description, only some devices of the magnetic force microscope (MFM) are shown in FIG. 1. However, other well-known devices to those skilled in the art are also within the scope of the invention.

The basic principles of operation of the magnetic force microscope (MFM) are described as follows. When the tip 10 and sample 70 are very close, the cantilever 20 is bent by the interaction between the tip 10 and sample 70. Thus, once a light of the laser 40 is irradiated on the cantilever 20, the light is then reflected from the bended cantilever 20 to the photodiode 50. The topographic images of the sample 70 are obtained by measuring the changes in laser reflection angles by the photodiode 50 and computer simulation calculation. In other words, the topographic information is obtained by measuring the interaction between the tip 10 and the sample 70.

The method for detecting and imaging magnetic metalloproteins of the invention is described as following. A substrate is provided, wherein the substrate comprises a hydrophobic substrate which has a water contact angle of about 50°-100°, and preferably 60°-80°.

Note that the substrate may itself have hydrophobic property, or the hydrophobic substrate is obtained by performing a plasma treatment on a hydrophilic substrate (such as glass or metal substrate) or binding a hydrophobic polymer (such as fluoro-polymer or silane) on a surface of the hydrophilic substrate.

Then, a plurality of magnetic metalloproteins is formed on the substrate, wherein a metal of the magnetic metalloproteins comprises iron, cobalt or nickel, and the magnetic metalloproteins comprise ferritin proteins or lactoferrin proteins. Note that the "magnetic" here may be paramagntism, diamagnetism or super paramagntism, wherein only the metalloproteins with magnetic property are included in the scope of the invention.

In one embodiment, a polydimethylsiloxane (PDMS) polymer is used as the substrate, and a copper grid is put on the PDMS substrate. The PDMS substrate is divided into a hydrophobic region and a hydrophilic region by performing a plasma treatment. Then, the magnetic metalloproteins are formed on the hydrophobic region by drop cast the liquid-state magnetic metalloproteins onto the PDMS substrate.

The topographic images, phase images and MFM images are obtained by detecting and imaging of the magnetic metalloproteins by MFM.

A two-pass mode of the magnetic force microscopy (MFM) is utilized to detect and image the magnetic metalloproteins. Firstly, a first pass mode is carried out by using a tapping mode to scan the topography of the magnetic metalloproteins. In the tapping mode, the tip is quickly oscallated by the cantilever with an oscallation frequency of about 5-500 kHz and therefore the frequency, amplitude and phase of the tip is changed as the tip contacts with the sample. Thus, the topographic images and the phase images are obtained.

Then, a second pass is carried out by lifting the tip of the MFM to a height and scanning magnetic metalloproteins along the trace of the first pass to obtain the MFM images. When the tip is very close to the sample, the intermolecular interactions (such as van der waals forces or electrostatic forces) are greater than the magnetic forces. Thus, when the tip is far away from the sample, the magnetic information is solely obtained.

In one embodiment, the topographic images and the phase images of the ferritin proteins are obtained by the method of the invention, wherein the average height of ferritin proteins is about 13 nm, which corresponds to the size of individual ferritin proteins (Yamashita, Thin Solid Film 2001, Vol 393, p 12-18). The phase images reveal differences in material properties or hardness of samples. The outer shell exhibits a bright phase signal compared to a hard inner core. Thus, the data show that the ferritin proteins have a harder core and a softer shell, because the shell is formed by the organic compounds which are softer than the inner core (formed by the iron oxide). In the second pass mode, the lift height is about 10 nm, and the MFM images show a lot of highlights to indicate the magnetic signal of a single ferritin protein.

In prior art, as those skilled in the art use the MFM to detect the magnetic force of the magnetic metal nanoparticles, the metal nanoparticles easily aggregate due to the intermolecular interactions formed between them. Thus, it is hard to measure the magnetic force of a single metal nanoparticle. The magnetic metalloproteins having hydrophobic shell are formed on the hydrophobic substrate to reduce the intermolecular interactions, and further to prevent the metalloproteins from aggregating in the substrate. Thus, a single ferritin protein may be observed.

Additionally, compared to the prior art (for example, electron microscopy is operated in a vacuum environment), detecting and imaging magnetic metalloproteins of the invention is carried out under an ambient atmospheric environment (that is, at one atmosphere (1 atm) and room temperature of about 25° C.-30° C.). Thus, the original characteristics of the metalloproteins are preserved and the structure of the metalloproteins is not destroyed.

Moreover, a single ferritin protein is detected and imaged by the method of the invention without imposing additional magnetic fields on the sample. An oscillation energy is provided from the piezo to the tip, and the appropriate oscillation of the tip is chosen according to the dimension of the tip. Thus, the changes in magnetic forces between the tip and the samples are detected without imposing additional magnetic fields on the sample.

A curve of the phase shift values, as a function of lift height, is obtained from the phase images and the MFM images. The magnetic moment ($m_s$) is described as the following equation (I):

$$\delta\varphi = \frac{\mu_0}{4\pi}\frac{12\pi Q}{(d/2+R+c+s)^5}m_p m_s\frac{180}{\pi} \quad \text{(I)}$$

wherein $\delta\phi$ is phase shift, $\mu_0$ is the permeability of a vacuum (about $4\pi\times10^{-7}$ N/A$^2$);

Q is quality factor (about 87.5);

K is spring constant of the MFM cantiever;

d is the diameter of ferritin proteins;

R is the outer shell radius of the MFM tip;

C is the thickness of the Cr layer to prevent oxidation of the magnetic coating (typically 20 nm);

s is the distance between the tip and sample;

$m_p$ is magnetic moment of tip (about $2\times10^{-12}$ Am$^2$); and $m_s$ is magnetic moment of the sample.

In one embodiment, $\mu_0$ is $4\pi\times10^{-7}$ N/A$^2$; Q is 87.5; k is 0.87383 N/m; R is $70\times10^{-9}$ m; c is $20\times10^{-9}$ m; $m_p$ is $2\times10^{-12}$ Am$^2$; d is $13\times10^{-9}$ m; $\delta\Phi$ and s is as following:

| s | 0 | 10 | 20 | 30 | 40 | 50 | 60 |
|---|---|---|---|---|---|---|---|
| δϕ | 30 | 24 | 20 | 10 | 2.5 | 2 | 2 |

According to the equation (I), the average $m_s$ value of a single ferritin protein is about $6.76\times10^{-21}$ Am$^2$. The data demonstrates that $m_s$ is in the order of twenty-one. Thus, the method of the invention has a low detection limit and high sensitivity.

The magnetic metalloproteins of the invention having a hydrophobic shell are formed on the hydrophobic substrate to prevent the metalloproteins from aggregating on the substrate. Additionally, the topographic images, phase images and MFM images of a single ferritin protein are detected and imaged by MFM. The method of the invention has the potential to detect the magnetic metalloproteins of the real sample to help diagnosis and treatment of diseases.

EXAMPLE

Example 1

The PDMS (polydimethylsiloxane) polymer solutions (A reagent:B reagent=10:1 (w/w)) were poured onto a clean glass and then cured in an oven (Memmert, Germany) at 70° C. for 2 hours to cure a PDMS layer. 10-60 μL of a deionized water (Millpore, Milli-Q purification system, R≥18.2Ω) was applied on the PDMS layer and then a copper TEM grid (1000 mesh EMITECH-squaretype-3.2 mm diameter) was placed on the PDMS layer. Next, the PDMS layer covered with the copper TEM grid was exposed to a low-pressure air plasma (Harrick Scientific Products, Inc. Model PDC-001) to obtain a patterned PDMS layer, wherein a plasma treatment was conducted at a pressure of about 20 Pa-100 Pa, at a power of about 5 W-20 W, and at an exposure time of about 30 s-5 min.

The patterned PDMS layer was divided into a hydrophobic region and a hydrophilic region, wherein a region uncovered by the copper TEM grid was the hydrophobic region, and a region covered by the copper TEM grid was the hydrophilic region.

10 μL of human liver ferritin proteins (Sigma, Type IV) was dipped on the patterned PDMS layer. Because the ferritin proteins had a hydrophobic core, it formed on the hydrophobic region of the patterned PDMS layer.

Figure 3:
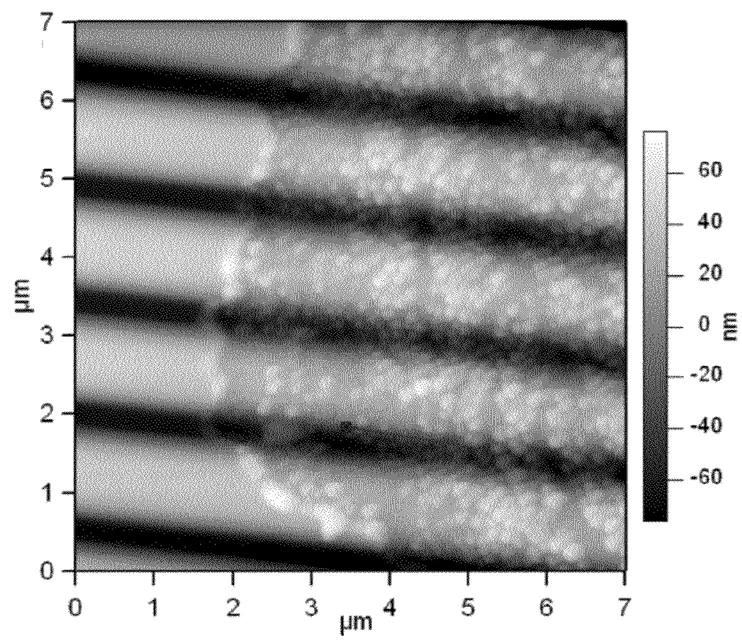
FIG. 3 shows the topographic image of the ferritin proteins (7 m×7 m).
Figure 4:
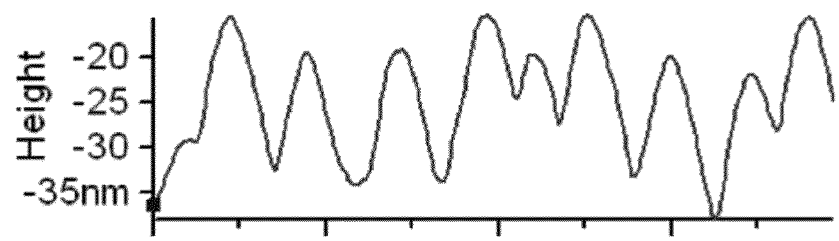
FIG. 4 shows the topographic profile across the line scan shown in FIG. 3, wherein the average height of the ferritin protein was about 13 nm.
Figures 5, 6:
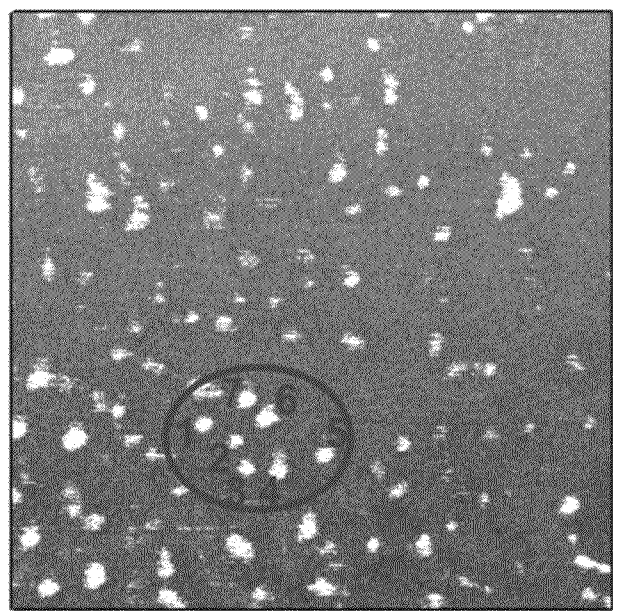
FIG. 5 shows the phase image of the ferritin proteins, wherein the outer shell of the ferritin proteins exhibited a brighter phase signal when compared to the inner core.
FIG. 6 shows an MFM image of ferritin proteins with a 10 nm lift height.

Then, the ferritin proteins were detected and imaged by MFM. FIG. 3 shows the topographic image of the ferritin proteins (7 μm×7 μm). FIG. 4 shows the topographic profile across the line scan shown in FIG. 3, wherein the average height of the ferritin protein was about 13 nm. FIG. 5 shows the phase image of the ferritin proteins, wherein the outer shell of the ferritin proteins exhibited a brighter phase signal when compared to the inner core. FIG. 6 shows an MFM image of ferritin proteins with a 10 nm lift height. Referring to FIG. 4 and FIG. 5, the black circles in each image enclosed seven (7) ferritin proteins. Thus, not only were the phase images but also the MFM images of a single ferritin protein were obtained by the method of the invention.

Figure 2:
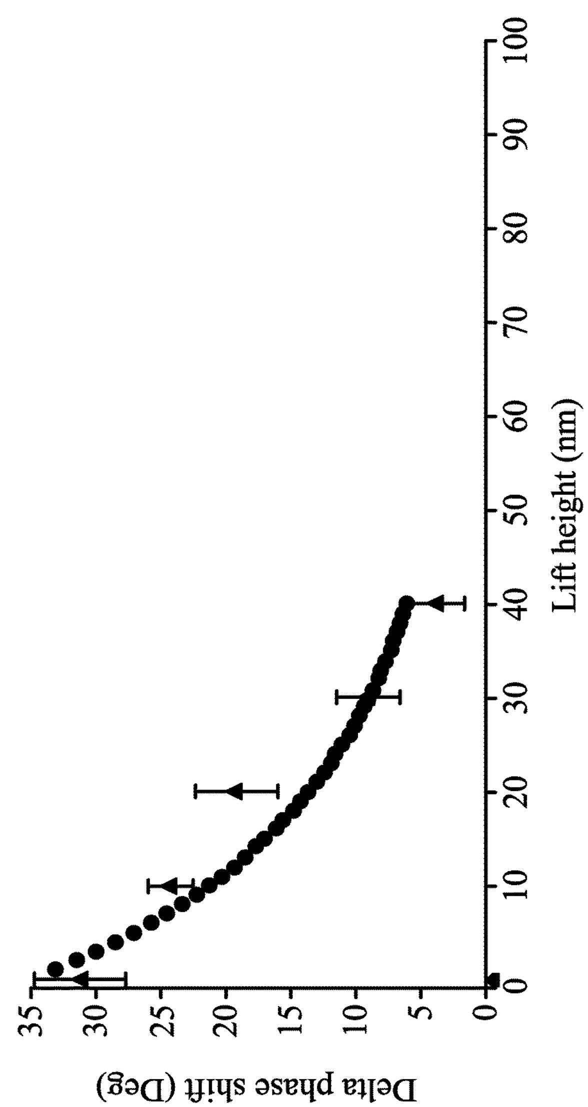
FIG. 2 shows a curve of the phase shift values as a function of lift height from MFM experiments to estimate the magnetic moment ($m_s$) of the ferritin proteins in accordance with the invention.

FIG. 2 shows a curve of the phase shift values as a function of lift height of the ferritin proteins. The data of FIG. 2 is calculated by equation (I), and the ms values of $6.76\times10^{-21}$ $Am^2$, $6.74\times10^{-21}$ $Am^2$, $6.76\times10^{-21}$ $Am^2$, $6.79\times10^{-21}$ $Am^2$, $6.69\times10^{-21}$ $Am^2$, $6.9\times10^{-21}$ $Am^2$, and $6.88\times10^{-21}$ $Am^2$ were obtained, for seven ferritin proteins of FIG. 5, respectively. The $m_s$ data was in the order of twenty-one; thus the method of the invention has high sensitivity.

Example 2

10 μL of human liver ferritin proteins (Sigma, Type IV) was dipped on the highly Oriented Pyrolytic Graphite (HOPG). Because the HOPG is a hydrophobic substrate, the ferritin proteins were uniformly distributed and formed on the HOPG substrate. Additionally, a single ferritin protein was also observed in the topographic images of the Example 2.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for detecting and imaging magnetic metalloproteins, comprising:
- providing a substrate;
- forming a plurality of magnetic metalloproteins on the substrate, wherein the magnetic metalloproteins have a hydrophobic shell;
- detecting and imaging the magnetic metalloproteins by magnetic force microscopy (MFM) to obtain topographic images, phase images and MFM images of the magnetic metalloproteins; and
- obtaining the topographic images, phase images and MFM images of a single magnetic metalloprotein.

2. The method for detecting and imaging magnetic metalloproteins as claimed in claim 1, wherein the substrate comprises a hydrophobic substrate.

3. The method for detecting and imaging magnetic metalloproteins as claimed in claim 2, wherein the hydrophobic substrate has a water contact angle of about 50°-100°.

4. The method for detecting and imaging magnetic metalloproteins as claimed in claim 1, wherein a metal of the magnetic metalloproteins comprises iron, cobalt or nickel.

5. The method for detecting and imaging magnetic metalloproteins as claimed in claim 1, wherein the magnetic metalloproteins comprise ferritin proteins or lactoferrin proteins.

6. The method for detecting and imaging magnetic metalloproteins as claimed in claim 1, wherein the magnetic metalloproteins have a hydrophobic core.

7. The method for detecting and imaging magnetic metalloproteins as claimed in claim 1, wherein detecting and imaging the magnetic metalloproteins are carried out under an ambient atmospheric environment.

8. The method for detecting and imaging magnetic metalloproteins as claimed in claim 1, wherein a two-pass mode of the magnetic force microscopy (MFM) is utilized to detect and image the magnetic metalloproteins.

9. The method for detecting and imaging magnetic metalloproteins as claimed in claim 8, wherein the two-pass mode comprises:
- carrying out a first pass by using a tapping mode to scan the topography of the magnetic metalloproteins to obtain topographic images and phase images; and
- carrying out a second pass by lifting a tip of the MFM to a height and scanning the magnetic metalloproteins along the trace of the first pass to obtain the MFM images.

* * * * *